United States Patent
Kher et al.

(10) Patent No.: US 8,071,167 B2
(45) Date of Patent: Dec. 6, 2011

(54) SURFACE PRE-TREATMENT FOR ENHANCEMENT OF NUCLEATION OF HIGH DIELECTRIC CONSTANT MATERIALS

(75) Inventors: Shreyas S. Kher, Campbell, CA (US); Shixue Han, Milpitas, CA (US); Craig R. Metzner, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/794,047

(22) Filed: Jun. 4, 2010

(65) Prior Publication Data

US 2010/0239758 A1    Sep. 23, 2010

Related U.S. Application Data

(63) Continuation of application No. 11/456,062, filed on Jul. 6, 2006, which is a continuation of application No. 10/302,752, filed on Nov. 21, 2002, now abandoned.

(60) Provisional application No. 60/388,928, filed on Jun. 14, 2002.

(51) Int. Cl.
  *C23C 16/40* (2006.01)
(52) U.S. Cl. ............. 427/255.29; 427/255.31; 427/307; 117/88; 117/90
(58) Field of Classification Search ............. 427/255.28, 427/255.29, 255.31, 307, 534; 117/88, 90
See application file for complete search history.

(56) References Cited

U.S. PATENT DOCUMENTS

| | | | |
|---|---|---|---|
| 4,693,208 A | 9/1987 | Sakai | |
| 5,290,609 A | 3/1994 | Horiike et al. | |
| 5,374,570 A | 12/1994 | Nasu et al. | |
| 5,521,126 A | 5/1996 | Okamura et al. | |
| 5,807,792 A | 9/1998 | Ilg et al. | |
| 5,916,365 A | 6/1999 | Sherman | |
| 6,013,553 A | 1/2000 | Wallace et al. | |
| 6,020,024 A | 2/2000 | Maiti et al. | |
| 6,020,243 A | 2/2000 | Wallace et al. | |

(Continued)

FOREIGN PATENT DOCUMENTS

EP    0 464 515    1/1992

(Continued)

OTHER PUBLICATIONS

Argarwal, et al. "Challenges in Integrating the High-K Gate Dielectric Film to the Conventional CMOS Process Flow," Mat. Sec. Soc. Symp. Proc. vol. 670 (2001), pp. K2.1.1-K2.1.11.

(Continued)

*Primary Examiner* — Bret Chen
(74) *Attorney, Agent, or Firm* — Patterson & Sheridan, L.L.P.

(57) ABSTRACT

Embodiments of the present invention relate to a surface preparation treatment for the formation of thin films of high k dielectric materials over substrates. One embodiment of a method of forming a high k dielectric layer over a substrate includes pre-cleaning a surface of a substrate to remove native oxides, pre-treating the surface of the substrate with a hydroxylating agent, and forming a high k dielectric layer over the surface of the substrate. One embodiment of a method of forming a hafnium containing layer over a substrate includes introducing an acid solution to a surface of a substrate, introducing a hydrogen containing gas and an oxygen containing gas to the surface of the substrate, and forming a hafnium containing layer over the substrate.

20 Claims, 8 Drawing Sheets

U.S. PATENT DOCUMENTS

| Patent No. | Kind | Date | Inventor(s) | Ref |
|---|---|---|---|---|
| 6,025,627 | A | 2/2000 | Forbes et al. | |
| 6,060,755 | A | 5/2000 | Ma et al. | |
| 6,124,158 | A | 9/2000 | Dautartas et al. | |
| 6,144,060 | A | 11/2000 | Park et al. | |
| 6,149,829 | A | 11/2000 | Takamatsu et al. | |
| 6,174,809 | B1 | 1/2001 | Kang et al. | |
| 6,200,893 | B1 | 3/2001 | Sneh | |
| 6,203,613 | B1 | 3/2001 | Gates et al. | |
| 6,207,487 | B1 | 3/2001 | Kim et al. | |
| 6,238,734 | B1 | 5/2001 | Senzaki et al. | |
| 6,270,572 | B1 | 8/2001 | Kim et al. | |
| 6,284,652 | B1 | 9/2001 | Charneski et al. | |
| 6,287,965 | B1 | 9/2001 | Kang et al. | |
| 6,291,283 | B1 | 9/2001 | Wilk | |
| 6,291,867 | B1 * | 9/2001 | Wallace et al. | 257/410 |
| 6,297,539 | B1 | 10/2001 | Ma et al. | |
| 6,299,294 | B1 | 10/2001 | Regan | |
| 6,305,314 | B1 | 10/2001 | Sneh et al. | |
| 6,342,277 | B1 | 1/2002 | Sherman | |
| 6,348,386 | B1 | 2/2002 | Gilmer | |
| 6,348,420 | B1 | 2/2002 | Raaijmakers et al. | |
| 6,372,598 | B2 | 4/2002 | Kang et al. | |
| 6,391,785 | B1 | 5/2002 | Satta et al. | |
| 6,391,803 | B1 | 5/2002 | Kim et al. | |
| 6,395,650 | B1 | 5/2002 | Callegari et al. | |
| 6,399,208 | B1 | 6/2002 | Baum et al. | |
| 6,399,491 | B2 | 6/2002 | Jeon et al. | |
| 6,416,577 | B1 | 7/2002 | Suntoloa et al. | |
| 6,420,279 | B1 | 7/2002 | Ono et al. | |
| 6,451,119 | B2 | 9/2002 | Sneh et al. | |
| 6,451,695 | B2 | 9/2002 | Sneh | |
| 6,452,229 | B1 | 9/2002 | Krivokapic | |
| 6,462,367 | B2 | 10/2002 | Marsh et al. | |
| 6,468,924 | B2 | 10/2002 | Lee et al. | |
| 6,475,276 | B1 | 11/2002 | Elers et al. | |
| 6,475,910 | B1 | 11/2002 | Sneh | |
| 6,482,262 | B1 | 11/2002 | Elers et al. | |
| 6,492,283 | B2 | 12/2002 | Raaijmakers et al. | |
| 6,514,808 | B1 * | 2/2003 | Samavedam et al. | 438/197 |
| 6,534,395 | B2 | 3/2003 | Werkhoven et al. | |
| 6,552,485 | B2 | 4/2003 | Gehring et al. | |
| 6,599,572 | B2 | 7/2003 | Saanila et al. | |
| 6,607,973 | B1 | 8/2003 | Jeon | |
| 6,620,723 | B1 | 9/2003 | Byun et al. | |
| 6,632,279 | B1 | 10/2003 | Ritala et al. | |
| 6,635,589 | B2 * | 10/2003 | Yamazaki et al. | 438/798 |
| 6,642,131 | B2 * | 11/2003 | Harada | 438/591 |
| 6,674,138 | B1 | 1/2004 | Halliyal et al. | |
| 6,713,846 | B1 * | 3/2004 | Senzaki | 257/635 |
| 6,737,341 | B1 * | 5/2004 | Yamamoto et al. | 438/585 |
| 6,794,314 | B2 * | 9/2004 | Raaijmakers et al. | 438/778 |
| 6,803,272 | B1 | 10/2004 | Halliyal et al. | |
| 6,815,285 | B2 | 11/2004 | Choi et al. | |
| 6,844,604 | B2 | 1/2005 | Lee et al. | |
| 6,919,263 | B2 * | 7/2005 | Aronowitz et al. | 438/591 |
| 2001/0000866 | A1 | 5/2001 | Sneh et al. | |
| 2001/0002280 | A1 | 5/2001 | Sneh | |
| 2001/0009695 | A1 | 7/2001 | Saanila et al. | |
| 2001/0021589 | A1 | 9/2001 | Wilk | |
| 2001/0024387 | A1 | 9/2001 | Raaijmakers et al. | |
| 2001/0024871 | A1 | 9/2001 | Yagi | |
| 2001/0028924 | A1 | 10/2001 | Sherman | |
| 2001/0029092 | A1 | 10/2001 | Park et al. | |
| 2001/0029891 | A1 | 10/2001 | Oh et al. | |
| 2001/0031562 | A1 | 10/2001 | Raaijmakers et al. | |
| 2001/0041250 | A1 | 11/2001 | Werkhoven et al. | |
| 2002/0000598 | A1 | 1/2002 | Kang et al. | |
| 2002/0005556 | A1 | 1/2002 | Cartier et al. | |
| 2002/0008297 | A1 | 1/2002 | Park et al. | |
| 2002/0014647 | A1 | 2/2002 | Seidl et al. | |
| 2002/0015790 | A1 | 2/2002 | Baum et al. | |
| 2002/0029092 | A1 | 3/2002 | Gass | |
| 2002/0031618 | A1 | 3/2002 | Sherman | |
| 2002/0043666 | A1 | 4/2002 | Parsons et al. | |
| 2002/0047151 | A1 | 4/2002 | Kim et al. | |
| 2002/0064970 | A1 | 5/2002 | Chooi et al. | |
| 2002/0074588 | A1 | 6/2002 | Lee | |
| 2002/0076831 | A1 | 6/2002 | Akimoto | |
| 2002/0076837 | A1 | 6/2002 | Hujanen et al. | |
| 2002/0081826 | A1 | 6/2002 | Rotondaro et al. | |
| 2002/0081844 | A1 | 6/2002 | Jeon et al. | |
| 2002/0086111 | A1 | 7/2002 | Byun et al. | |
| 2002/0093046 | A1 | 7/2002 | Moriya et al. | |
| 2002/0093781 | A1 | 7/2002 | Bachhofer et al. | |
| 2002/0098627 | A1 | 7/2002 | Pomarede et al. | |
| 2002/0106536 | A1 | 8/2002 | Lee et al. | |
| 2002/0142500 | A1 | 10/2002 | Foglietti et al. | |
| 2002/0146895 | A1 | 10/2002 | Ramdani et al. | |
| 2002/0151152 | A1 | 10/2002 | Shimamoto et al. | |
| 2002/0153579 | A1 | 10/2002 | Yamamoto | |
| 2002/0155722 | A1 | 10/2002 | Satta et al. | |
| 2002/0162506 | A1 | 11/2002 | Sneh et al. | |
| 2002/0172768 | A1 | 11/2002 | Endo et al. | |
| 2002/0175393 | A1 | 11/2002 | Baum et al. | |
| 2002/0177282 | A1 | 11/2002 | Song | |
| 2002/0182320 | A1 | 12/2002 | Leskela et al. | |
| 2002/0187256 | A1 | 12/2002 | Elers et al. | |
| 2002/0195643 | A1 | 12/2002 | Harada | |
| 2002/0197881 | A1 | 12/2002 | Ramdani et al. | |
| 2003/0013320 | A1 | 1/2003 | Kim et al. | |
| 2003/0015764 | A1 | 1/2003 | Raaijmakers et al. | |
| 2003/0031807 | A1 | 2/2003 | Elers et al. | |
| 2003/0032281 | A1 | 2/2003 | Werkhoven et al. | |
| 2003/0049931 | A1 | 3/2003 | Byun et al. | |
| 2003/0049942 | A1 | 3/2003 | Haukka et al. | |
| 2003/0060057 | A1 | 3/2003 | Raaijmakers et al. | |
| 2003/0068437 | A1 | 4/2003 | Nakamura et al. | |
| 2003/0072975 | A1 | 4/2003 | Shero et al. | |
| 2003/0082296 | A1 | 5/2003 | Elers et al. | |
| 2003/0082301 | A1 | 5/2003 | Chen et al. | |
| 2003/0089942 | A1 | 5/2003 | Bhattacharyya | |
| 2003/0096473 | A1 | 5/2003 | Shih et al. | |
| 2003/0104710 | A1 | 6/2003 | Visokay et al. | |
| 2003/0106490 | A1 | 6/2003 | Jallepally et al. | |
| 2003/0109114 | A1 | 6/2003 | Niwa | |
| 2003/0116804 | A1 | 6/2003 | Visokay et al. | |
| 2003/0133861 | A1 | 6/2003 | Bowen et al. | |
| 2003/0129826 | A1 | 7/2003 | Werkhoven et al. | |
| 2003/0160277 | A1 | 8/2003 | Bhattacharyya | |
| 2003/0168750 | A1 | 9/2003 | Basceri et al. | |
| 2003/0173586 | A1 | 9/2003 | Moriwaki et al. | |
| 2003/0185980 | A1 | 10/2003 | Endo | |
| 2003/0186495 | A1 | 10/2003 | Saanila et al. | |
| 2003/0186561 | A1 | 10/2003 | Law et al. | |
| 2003/0188682 | A1 | 10/2003 | Tois et al. | |
| 2003/0189232 | A1 | 10/2003 | Law et al. | |
| 2003/0190423 | A1 | 10/2003 | Yang et al. | |
| 2003/0194853 | A1 | 10/2003 | Jeon | |
| 2003/0205729 | A1 | 11/2003 | Basceri et al. | |
| 2003/0213987 | A1 | 11/2003 | Basceri et al. | |
| 2003/0219942 | A1 | 11/2003 | Choi et al. | |
| 2003/0227033 | A1 | 12/2003 | Ahn et al. | |
| 2003/0232501 | A1 | 12/2003 | Kher et al. | |
| 2003/0232506 | A1 | 12/2003 | Metzner et al. | |
| 2003/0232511 | A1 | 12/2003 | Metzner et al. | |
| 2003/0234417 | A1 | 12/2003 | Raaijmakers et al. | |
| 2003/0235961 | A1 | 12/2003 | Metzner et al. | |
| 2004/0005749 | A1 | 1/2004 | Choi et al. | |
| 2004/0007747 | A1 | 1/2004 | Visokay et al. | |
| 2004/0009307 | A1 | 1/2004 | Koh et al. | |
| 2004/0009675 | A1 | 1/2004 | Eissa et al. | |
| 2004/0016973 | A1 | 1/2004 | Rotondaro et al. | |
| 2004/0018723 | A1 | 1/2004 | Byun et al. | |
| 2004/0018747 | A1 | 1/2004 | Lee et al. | |
| 2004/0023461 | A1 | 2/2004 | Ahn et al. | |
| 2004/0023462 | A1 | 2/2004 | Rotondaro et al. | |
| 2004/0028952 | A1 | 2/2004 | Cartier et al. | |
| 2004/0029321 | A1 | 2/2004 | Ang et al. | |
| 2004/0033698 | A1 | 2/2004 | Lee et al. | |
| 2004/0036111 | A1 | 2/2004 | Nishikawa et al. | |
| 2004/0038554 | A1 | 2/2004 | Ahn et al. | |
| 2004/0040501 | A1 | 3/2004 | Vaartstra | |
| 2004/0043149 | A1 | 3/2004 | Gordon et al. | |
| 2004/0043569 | A1 | 3/2004 | Ahn et al. | |
| 2004/0043630 | A1 | 3/2004 | Vaartstra et al. | |
| 2004/0046197 | A1 | 3/2004 | Basceri et al. | |
| 2004/0048491 | A1 | 3/2004 | Jung et al. | |

| | | | |
|---|---|---|---|
| 2004/0051152 A1 | 3/2004 | Nakajima et al. | |
| 2004/0053484 A1 | 3/2004 | Kumar et al. | |
| 2004/0077182 A1 | 4/2004 | Lim et al. | |
| 2004/0216670 A1 | 11/2004 | Gutsche et al. | |
| 2004/0235285 A1 | 11/2004 | Kang et al. | |
| 2005/0006799 A1 | 1/2005 | Gregg et al. | |

FOREIGN PATENT DOCUMENTS

| | | |
|---|---|---|
| EP | 0 973 189 | 1/2000 |
| EP | 0 973 191 | 1/2000 |
| EP | 1 170 804 | 6/2001 |
| EP | 1 146 141 | 10/2001 |
| EP | 1 170 704 | 1/2002 |
| EP | 1 321 973 | 6/2003 |
| GB | 2 355 727 | 5/2001 |
| JP | 05-251339 | 9/1993 |
| JP | 06-196809 | 7/1994 |
| JP | 2001-011100 | 4/2001 |
| JP | 2001-172767 | 6/2001 |
| JP | 2002-060944 | 2/2002 |
| JP | 2002-069641 | 3/2002 |
| JP | 2002-093804 | 3/2002 |
| JP | 2002-167672 | 6/2002 |
| JP | 2002-172767 | 6/2002 |
| WO | WO 99/29924 | 6/1999 |
| WO | WO 00/13235 | 3/2000 |
| WO | WO 00/54320 | 9/2000 |
| WO | WO 00/70674 | 11/2000 |
| WO | WO 01/15220 | 3/2001 |
| WO | WO 01/25502 | 4/2001 |
| WO | WO 01/27346 | 4/2001 |
| WO | WO 01/27347 | 4/2001 |
| WO | WO 01/29280 | 4/2001 |
| WO | WO 01/29891 | 4/2001 |
| WO | WO 01/29893 | 4/2001 |
| WO | WO 01/40541 | 6/2001 |
| WO | WO 01/66832 | 9/2001 |
| WO | WO 01/82390 | 11/2001 |
| WO | WO 01/99166 | 12/2001 |
| WO | WO 02/01628 | 1/2002 |
| WO | WO 02/09167 | 1/2002 |
| WO | WO 02/27063 | 4/2002 |
| WO | WO 02/43115 | 5/2002 |
| WO | WO 02/45167 | 6/2002 |

OTHER PUBLICATIONS

Balog, et al. "Chemical Vapor Deposition and Characterization of HfO$_2$ Films from Organo-Hafnium Compounds," Thin Solid Films, 41 (1977), pp. 247-259.

Bedair "Atomic Layer Epitaxy Deposition Processes," J. Vac. Sci. Technol. B., vol. 12, No. 1, Jan./Feb. 1994, pp. 179-185.

Chatham, et al. "Nitridation of Hafnium Silicate Thin Films," Mat. Res. Soc. Symp. Proc. vol. 811, Apr. 12-16, 2004, D7.5.1-D7.5.6.

Cheon, et al. "Gas Phase Photoproduction of Diatomic Metal Nitrides During Metal Nitride Laser Chemical Vapor Deposition," Inorg. Chem. 1999, 38, pp. 2238-2239.

Choi, et al. "Stability of TiB$_2$ as a Diffusion Barrier on Silicon," J. Electrochem. Soc., vol. 138, No. 10, Oct. 1991, pp. 3062-3067.

Choi, et al. "The Effect of Annealing on Resistivity of Low Pressure Chemical Vapor Deposited Titanium Diboride," J. Appl. Phys. 69(11), Jun. 1, 1991, pp. 7853-7861.

Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001), pp. K2.2.1-K2.2.6.

Conley, et al. "Interval Annealing During Alternating Pulse Deposition," Mat. Res. Soc. Symp. Proc. vol. 811, Apr. 12-16, 2004, D1.3.1-D1.3.6.

Derbyshire "Applications of Integrated Processing," Solid State Technology, Dec. 1994, pp. 45-48.

Elers, et al. "NbCl$_5$ as a Precursor in Atomic Layer Epitaxy," Applied Surface Science 82/83 (1994), pp. 468-474.

George, et al. "Surface Chemistry for Atomic Layer Growth," J. Phys. Chem. (1996), 100, pp. 13121-13131.

Goto, et al. "Atomic layer controlled deposition of silicon nitride with self-limiting mechanism," Applied Physics Letters, American Institute of Physics. New York, US, vol. 68, No. 23, Jun. 3, 1996, pp. 3257-3259.

Hendrix, et al. "Composition Control of Hf$_{1-x}$Si$_x$O$_2$ Films Deposited on Si by Chemical-vapor Deposition Using Amide Precursors," Applied Physics Letters, vol. 80, No. 13 (Apr. 1, 2002), pp. 2362-2364.

Ho, et al. "Suppressed crystallization of Hf-based gate dielectrics by controlled addition of Al$_2$O$_3$ using atomic layer deposition", Applied Physics Letters, American Institute of Physics, New York, US, vol. 81, No. 22, Nov. 25, 2002, pp. 4218-4220.

Hwang, et al. "Nanometer-Size α-PbO$_2$-type TiO$_2$ in Garnet: A Thermobarometer for Ultrahigh-Pressure Metamorphism," Science Vo. 288 (Apr. 14, 2000), pp. 321-324.

International Search Report and Written Opinion for International Application No. PCT/US2005/016606 dated Aug. 22, 2005.

International Search Report and Written Opinion for International Application No. PCT/US2005/016603 dated Sep. 15, 2005.

International Search Report and Written Opinion for International Application No. PCT/US2005/016690 dated Aug. 22, 2005.

Kamiyama, et al. "Improvement in the uniformity and the thermal stability of Hf-silicate gate dielectric by plasma-nitridation," Gate Insulator, 2003. IWGI 2003. Extended Abstracts of International Workshop on Nov. 6-7, 2003, Piscataway, NJ, USA, IEEE, Nov. 6, 2002, pp. 42-46.

Kattelus, et al. "Electrical Properties of Tantalum Based Composite Oxide Films," Mat. Res. Soc. Symp. Proc., 284 (1993), pp. 511-516.

Kawahara, et al. "Effects of Hf sources, oxidizing agents, and NH$_3$ radicals on properties of HfAlO$_x$ films prepared by atomic layer deposition," IWGI 2003, Tokyo, Nov. 6, 2003, pp. 32-37.

Kukli, et al. "Atomic Layer Deposition of Hafnium Dioxide Films from Hafnium Tetrakis(ethylmethylamide) and Water," Chemical Vapor Deposition, VCH Publishers, Weinheim, DE, vol. 8, No. 5, Sep. 2002, pp. 199-204.

Kukli, et al. "Tailoring the Dielectric Properties of HfO$_2$-Ta$_2$O$_5$ Nanolaminates," Applied Physics Letters, vol. 68, No. 26 (Jun. 24, 1996), pp. 3737-3739.

Lee, et al. "Cyclic Technique for the Enhancement of Highly Oriented Diamond Film Growth," Thin Solid Films 303 (1997), pp. 264-269.

Niinisto, et al. "Synthesis of Oxide Thin Films and Overlayers by Atomic Layer Epitaxy for Advanced Applications," Materials Science and Engineering B41 (1996), pp. 23-29.

Ohshita, et al. "Hf$_{1-x}$Si$_x$O$_2$ deposition by metal organic chemical vapor deposition using the Hf(NEt$_2$)$_4$/SiH(NEt$_2$)$_3$/O$_2$ gas system," Preparation and Characterization, Elsevier Sequioa, NL, vol. 416, No. 1-2, Sep. 2, 2002, pp. 208-211.

Ohshita, et al. "HfO$_2$ Growth by Low-pressure Chemical Vapor Deposition Using the Hf(N(C$_2$H$_5$)$_2$)$_4$/O$_2$ Gas System," Journal of Crystal Growth 233 (2001), pp. 292-297.

Ritala "Atomic Layer Epitaxy," Ann. Acad. Sci. Fenn. Ser. All Chemica, vol. 257 (1994).

Ritala, et al. "Atomic Layer Deposition of Oxide Thin Films with Metal Alkoxides as Oxygen Sources," Science vol. 288, Apr. 14, 2000, pp. 319-321.

Ritala, et al. "Development of Crystallinity and Morphology in Hafnium Dioxide Thin Films Grown by Atomic Layer Epitaxy," Thin Solid Films, vol. 250, No. 1-2, (Oct. 1, 1994), pp. 72-80.

Sekine, et al. "Nitrogen profile control by plasma nitridation technique for poly-Si gate HfSiON CMOSFET with excellent interface property and ultra-low leakage current," International Electron Devices Meeting 2003. IEDM. Technical Digest. Washington, DC, Dec. 8-10, 2003, New York, NY, IEEE, US, Dec. 8, 2003, pp. 103-106.

Senzaki, et al. "A Novel Atomic Layer Deposition Process to Deposit Hafnium Silicate Thin Films," Electrochemical Society Proceedings vol. 2004-01, pp. 264-270.

Visokay, et al. "Application of HfSiON as a gate dielectric material," Applied Physics Letter, American Institute of Physics, New York, US, vol. 80, No. 17, Apr. 29, 2002, pp. 3183-3185.

* cited by examiner

US 8,071,167 B2

SURFACE PRE-TREATMENT FOR ENHANCEMENT OF NUCLEATION OF HIGH DIELECTRIC CONSTANT MATERIALS

CROSS-REFERENCE TO RELATED APPLICATIONS

This application is a continuation of U.S. patent application Ser. No. 11/456,062 filed Jul. 6, 2006, which is a continuation of U.S. patent application Ser. No. 10/302,752, filed Nov. 21, 2002 now abandoned, which application claims benefit of U.S. Provisional Patent Application Ser. No. 60/388,928, filed Jun. 14, 2002, both of which are herein incorporated by reference.

BACKGROUND OF THE INVENTION

1. Field of the Invention

Embodiments of the present invention relate to the formation of thin films of high k dielectric materials over substrates for use in manufacturing semiconductor devices, flat-panel display devices, and other electronic devices. More particularly, embodiments of the present invention relate to a surface preparation treatment for the formation of thin films of high dielectric constant materials over substrates.

2. Description of the Related Art

In the field of semiconductor processing, flat-panel display processing or other electronic device processing, chemical vapor deposition has played an important role in forming films on substrates. As the geometries of electronic devices continue to shrink and the density of devices continues to increase, the size and aspect ratio of the features are becoming more aggressive, e.g., feature sizes of 0.07 microns and aspect ratios of 10 or greater are being considered. Accordingly, conformal deposition of materials to form these devices is becoming increasingly important.

High dielectric constant materials, such as metal oxides, are one type of thin film being formed over substrates. Problems with current methods of forming metal oxide films over substrates include high surface roughness, high crystallinity, and/or poor nucleation of the formed metal oxide film.

Therefore, there is a need for improved processes and apparatuses for forming high k dielectric materials over substrates.

SUMMARY OF THE INVENTION

Embodiments of the present invention relate to a surface preparation treatment for the formation of thin films of high k dielectric materials over substrates. One embodiment of a method of forming a high k dielectric layer over a substrate includes pre-cleaning a surface of a substrate to remove native oxides, pre-treating the surface of the substrate with a hydroxylating agent, and forming a high k dielectric layer over the surface of the substrate. One embodiment of a method of forming a hafnium containing layer over a substrate includes introducing an acid solution to a surface of a substrate, introducing a hydrogen containing gas and an oxygen containing gas to the surface of the substrate, and forming a hafnium containing layer over the substrate.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the present invention relate to the formation of high k dielectric materials over substrates. High k dielectric materials include hafnium containing materials, aluminum oxides, zirconium oxides, lanthanum oxides, yttrium oxides, tantalum oxides, other suitable materials, composites thereof, or combinations thereof. Hafnium containing high k dielectric materials include hafnium oxides (e.g., $HfO_2$), hafnium silicates (e.g., HfSiO), hafnium nitrides (e.g., HfN), other suitable materials, composites thereof, or combinations thereof. The high k dielectric material preferably comprises hafnium oxides, hafnium silicates, composites thereof, or combinations thereof. Substrates include semiconductor wafers or glass substrates and may include materials formed thereover, such as dielectric materials, conductive materials, silicon layers, metal layers, etc.

Figure 1:
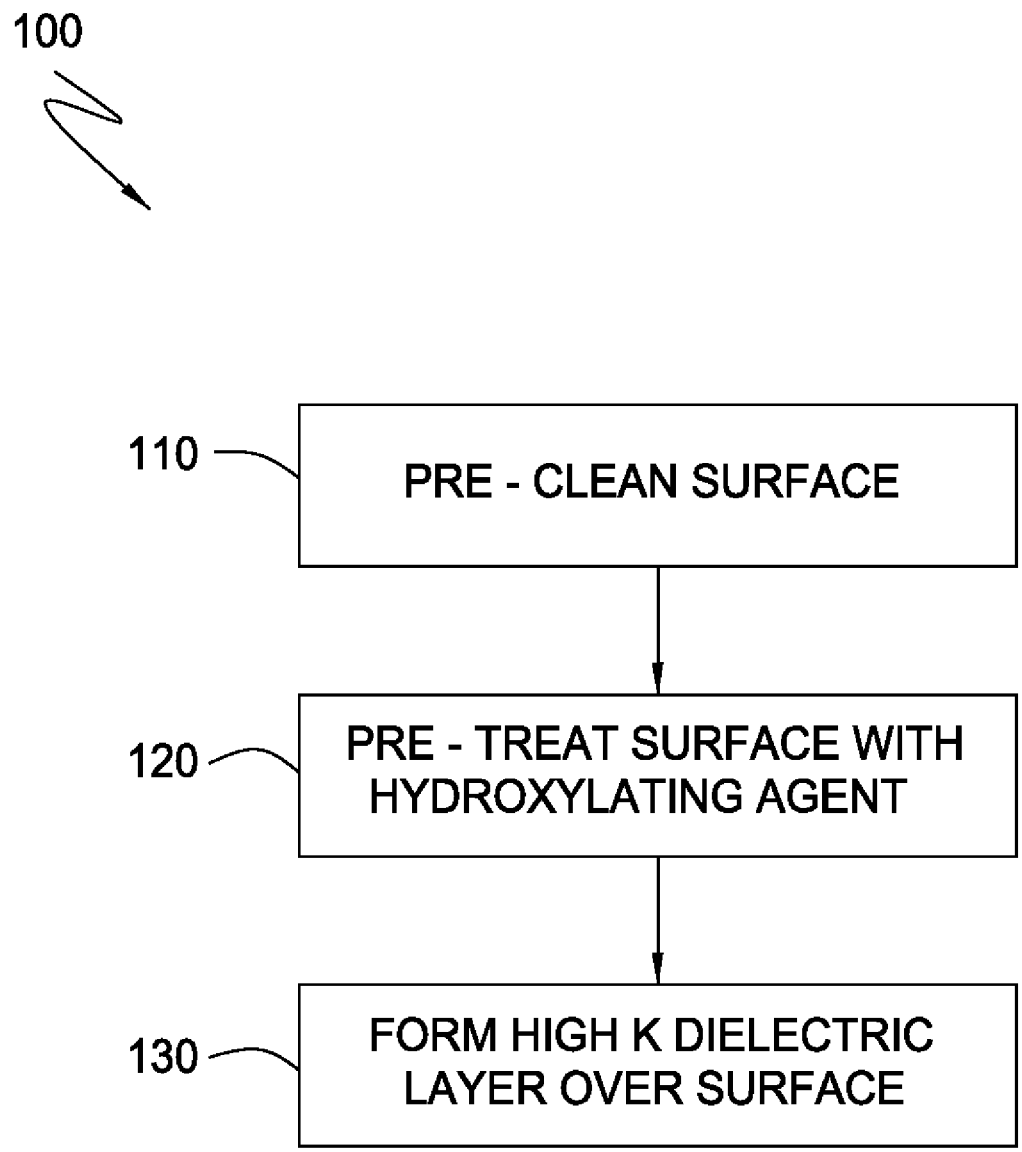
FIG. 1 is a flow chart of one embodiment of a method of forming a high k dielectric layer over a substrate.

FIG. 1 is a flow chart of one embodiment of a method 100 of forming a high k dielectric layer over a substrate. In step 110, the surface of a substrate is pre-cleaned to remove native oxides which may have formed over the surface of the substrate. In step 120, the surface of the substrate is pre-treated with a hydroxylating agent to perform a controlled hydroxylation of the substrate. In step 130, a high k dielectric layer is formed thereover.

Figure 2A:
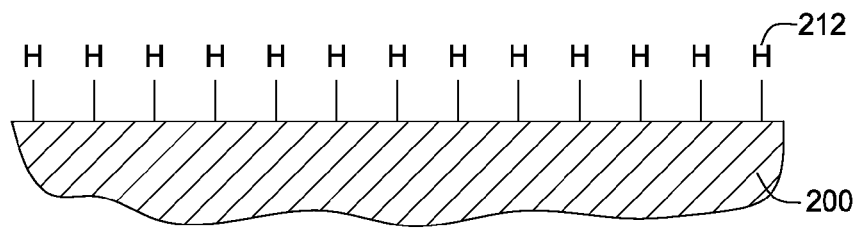
FIGS. 2A-C are schematic cross-sectional views of one embodiment of a substrate at certain stages in the method of FIG. 1.
Figure 2B:
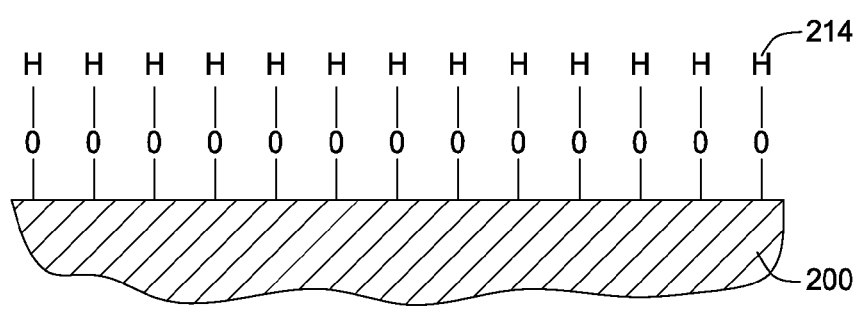
Figure 2C:
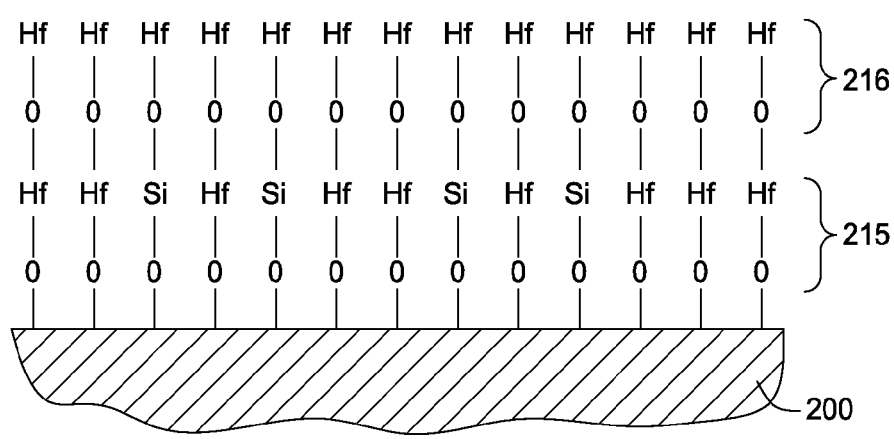

Not wishing to be bound by theory unless explicitly set forth in the claims, FIGS. 2A-C are schematic cross-sectional views of one embodiment of a silicon substrate 200 at certain stages in the method 100 of FIG. 1. For clarity of description, the method 100 will be described in reference to formation of a high k dielectric layer comprising a hafnium containing layer.

FIG. 2A shows the substrate 200 after the surface of the substrate is pre-cleaned to remove native oxides which may have formed over the substrate surface. It is believed that the pre-clean leaves the surface of a substrate with a silicon-hydrogen (Si—H) surface 212. FIG. 2B shows the substrate 200 after the surface of the substrate is pre-treated with a hydroxylating agent. It is believed that the hydroxylating agent converts the Si—H surface 212 of FIG. 2A into a silicon-hydroxy (Si—O—H) surface 214. FIG. 2C shows the substrate 200 after a hafnium containing layer 216, such as a hafnium oxide layer, has been formed over the surface of the substrate.

Figure 9A:
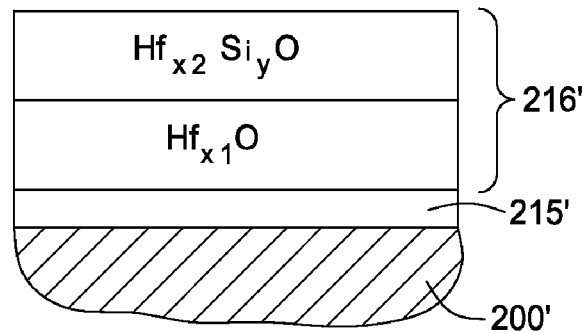
FIGS. 9A-9B are schematic cross-sectional views of embodiments of a hafnium containing layer comprising a plurality of layers formed over a substrate.
Figure 9B:
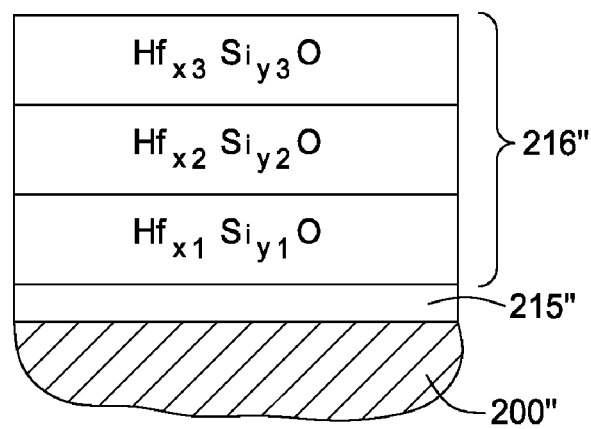

The hafnium containing layer 216 can comprise a single layer or a plurality of layers. If the hafnium containing layer 216 is made of a plurality of layers, each layer may be a different type of hafnium containing material, the same type of hafnium containing material, or combinations thereof. For example, FIG. 9A is a schematic cross-sectional view of one embodiment of a hafnium containing layer comprising a hafnium silicate material layer formed over a hafnium oxide material layer. In another example, FIG. 9B is a schematic cross-sectional view of one embodiment of a hafnium containing layer comprising a plurality of hafnium silicate layers. Each hafnium silicate layer may comprise the same or different proportions of hafnium, silicon, and oxygen atoms.

In reference to FIGS. 2A-C, it is believed that during formation of the hafnium containing layer 216 an interfacial layer 215 comprising hafnium silicates is formed between the hafnium containing layer 216 and the substrate 200. It is believed that in formation of the hafnium containing layer 216, less energy is required to break the bonds of the Si—O—H surface 214 of FIG. 2B to form the hafnium containing layer 216 than directly breaking the bonds of the Si—H surface 212 of FIG. 2A. In addition, the extent of hydroxylation of the surface of the substrate can be controlled, as opposed to hydroxylation by the atmosphere (native oxides), and the thickness of the interfacial layer 215 can be reduced.

It has been observed that a hafnium containing layer formed by the methods disclosed herein has improved film characteristics. The formed hafnium containing layer is amorphous and may be formed over a substrate with minimal formation of an interfacial layer 215, such as an interfacial layer having a thickness about 13 Å or less, more preferably about 6 Å or less. In addition, the formed hafnium containing layer has improved nucleation (fewer islands) over a substrate surface. In certain embodiments, a hafnium containing layer may be formed to a surface roughness (Rms) of less than about 4 Å, preferably less than about 3 Å, and more preferably about 2.55 Å or less.

Pre-Clean

Referring to step 110 of FIG. 1, pre-cleaning of a substrate surface may be performed by contacting the substrate surface with a cleaning solution in a batch clean system, in a single-substrate clean system, or any other suitable clean system. One example of a single-substrate clean system is an OASIS CLEAN™ system available from Applied Materials, Inc. of Santa Clara, Calif. The cleaning solution may be an RCA-type cleaning solution or any other suitable cleaning solution which removes native oxides, which may have formed over the substrate surface, and may involve single-step chemistry or multi-step chemistries. The substrate surface may be contacted with the cleaning solution for a specified time period.

Figure 3:
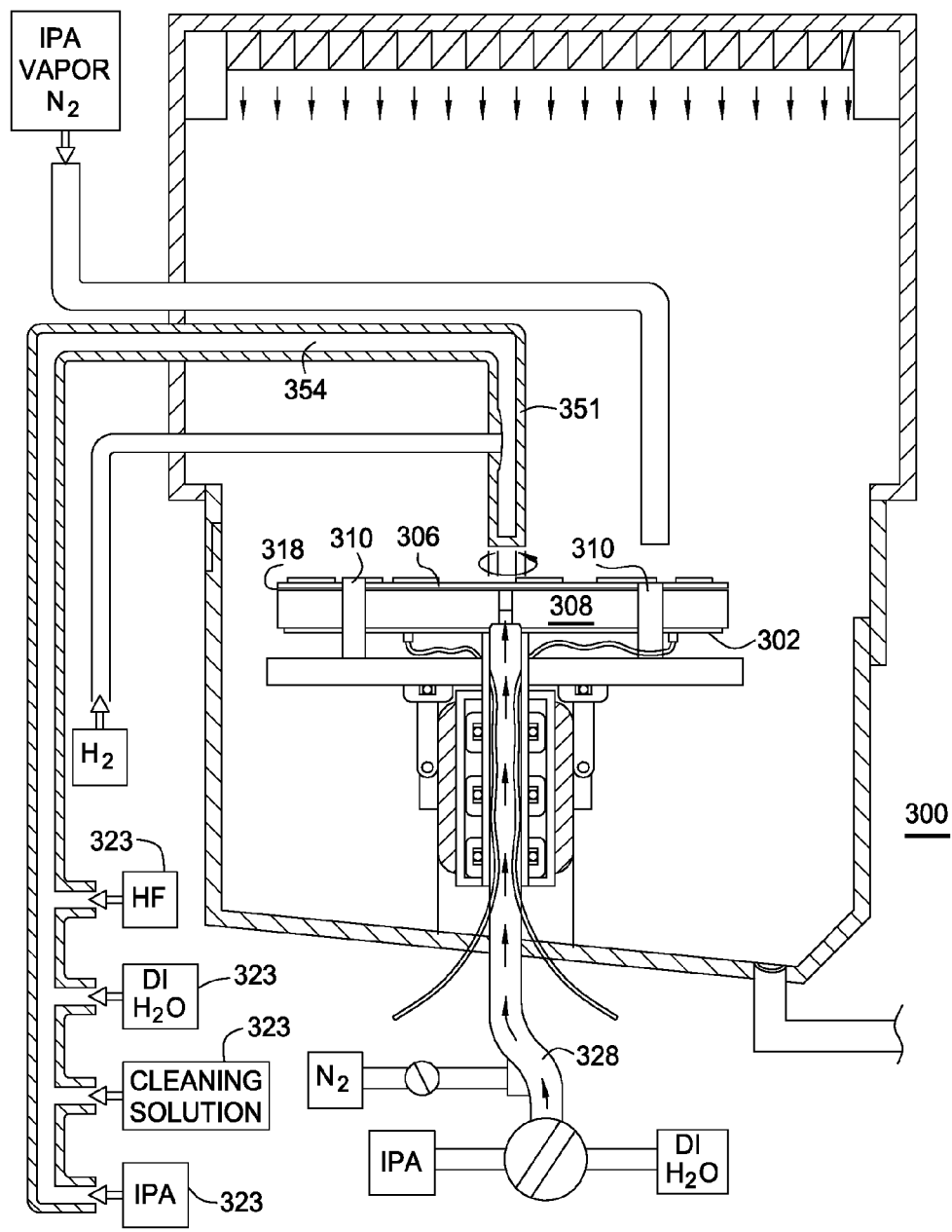
FIG. 3 is a schematic cross-section view of one embodiment of a single-substrate clean chamber.

FIG. 3 is a schematic cross-section view of one embodiment of a single-substrate clean chamber 300 which may be part of a multi-chamber system. The chamber 300 includes a platter 308 with a plurality of acoustic or sonic transducers 302 located thereon. The transducers 302 are attached to the bottom surface of platter 308. The transducers 302 create acoustic or sonic waves directed towards the surface of a substrate 306.

The substrate 306 is held at a distance above the top surface of platter 308. The substrate 306 is clamped by a plurality of clamps 310 face up and can rotate or spin substrate 306 about the substrate's central axis. In chamber 300, the clamps 310 and substrate 306 are rotated during use whereas platter 308 remains in a fixed position. Additionally, in chamber 300, substrate 306 is placed face up and the backside of the substrate faces platter 308, i.e., the side of the substrate with patterns or features faces towards one or more nozzles 351 which spray cleaning or etching chemicals thereon.

During use, deionized water (DI water) is fed through a feed through channel 328 and platter 308 and fills the gap between the backside of substrate 306 and platter 308 to provide a water filled gap 318 through which acoustic waves generated by transducers 302 can travel to substrate 306.

Additionally during use, cleaning solutions such as SC-1 and SC-2, etchants such as diluted hydrofluoric acid or buffered hydrofluoric acid, and rinsing water such as deionized water are fed through a plurality of nozzles 351 to the top surface of the substrate 306 while the substrate 306 is spun. Tanks 323 containing wet processing chemicals such as diluted hydrofluoric acid, de-ionized water, and cleaning solutions are coupled by conduit 354 to nozzles 351.

Other aspects and embodiments of a single-substrate clean system are disclosed in U.S. patent application Ser. No. 09/891,849, entitled "Method and Apparatus for Wafer Cleaning", filed Jun. 25, 2001 and in U.S. patent application Ser. No. 09/891,791, entitled "Wafer Spray Configurations for a Single Wafer Processing Apparatus," filed Jun. 25, 2001, both commonly assigned to Applied Materials, Inc. of Santa Clara, Calif., both of which are herein incorporated by reference in their entirety to the extent not inconsistent with the present disclosure.

One embodiment of the step 110 (FIG. 1) of pre-cleaning the substrate surface, which may be performed in the apparatus as described in reference to FIG. 3 or may be performed in other batch clean systems or single-substrate clean systems, comprises introducing a dilute hydrofluoric acid solution onto the substrate surface for a suitable time period, such as between about 5 seconds and about 1 hour or more, preferably between about 1 minute and about 15 minutes, more preferably about 2 minutes. Any suitable concentration of hydrofluoric acid may be used, preferably between about 1 weight percent and about 49 weight percent hydrofluoric acid, more preferably about 2 weight percent hydrofluoric acid. After introduction of a hydrofluoric acid solution to the substrate, the substrate surface is referred to a HF-last surface.

Pre-Treatment

Referring to FIG. 1, one embodiment of step 120 of pre-treating the substrate surface with a hydroxylating agent comprises contacting the surface of the substrate with water vapor generated in a flash in-situ steam generation (ISSG) process. In other embodiments, the hydroxylating agent may be other suitable compounds. The pre-treatment of the present invention can be carried out in a rapid thermal heating apparatus, such as, but not limited to, the RTP XE chamber, available from Applied Materials, Inc. of Santa Clara, Calif. One embodiment of a rapid thermal heating apparatus is disclosed in U.S. Pat. No. 6,037,273, entitled "Method and Apparatus for In situ Vapor Generation," assigned to Applied Materials, Inc. of .Santa Clara, Calif., which is a Continuation-In-Part Application to U.S. patent application Ser. No. 08/893,774, assigned to Applied Materials, Inc. of Santa Clara, Calif., both of which are incorporated by reference in their entirety to the extent not inconsistent with the present disclosure. Another suitable rapid thermal heating apparatus and its method of operation is set forth in U.S. Pat. No. 5,155,336, entitled "Rapid Thermal Heating Apparatus and Method," filed Oct. 24, 1991, which is herein incorporated by reference in its entirety to the extent not inconsistent with the present disclosure. Additionally, other types of thermal reactors may be utilized such as the Epi or Poly Centura single wafer "cold wall" reactor by Applied Materials, Inc. of Santa Clara, Calif.

Figure 4:
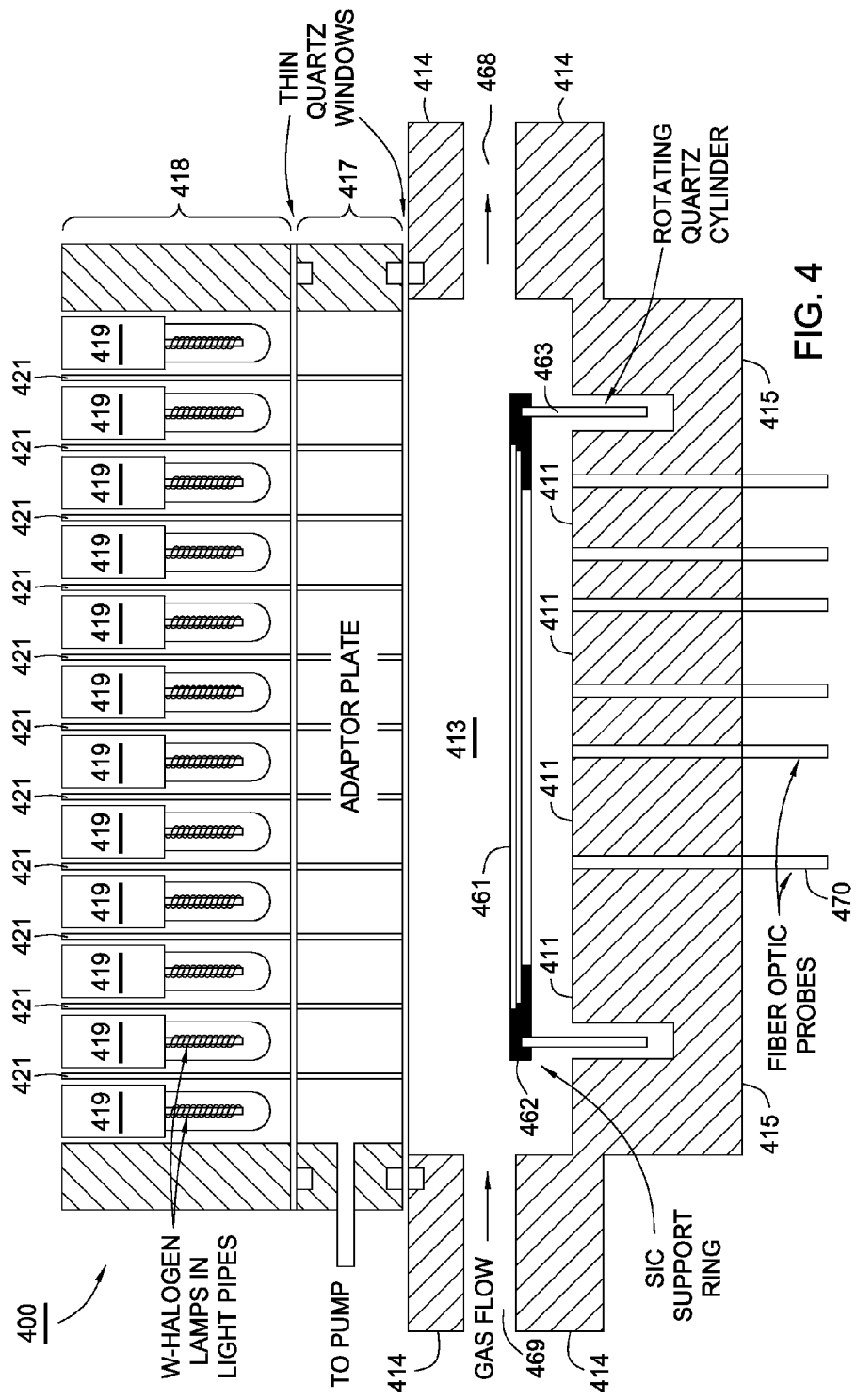
FIG. 4 is a schematic view of one embodiment of an apparatus adapted for rapid thermal processing.

FIG. 4 is a schematic view of one embodiment of an apparatus 400 adapted for rapid thermal processing. The apparatus 400 includes an evacuated process chamber 413 enclosed by a sidewall 414 and a bottom wall 415. A radiant energy light pipe assembly 418 is positioned over and coupled to window assembly 417. The radiant energy light pipe assembly 418 includes a plurality of tungsten halogen lamps 419 each mounted into a light pipe 421. Lamps 419 are positioned to adequately cover the entire surface area of substrate 461. A window assembly 417 may be disposed below the light pipe assembly 418.

A substrate (wafer) 461 is supported inside chamber 413 by a support ring 462 which engages the substrate near its edge. Support ring 462 is mounted on a rotatable quartz cylinder 463. By rotating quartz cylinder 463, support ring 462 and wafer 461 can be caused to rotate.

The bottom wall 415 of apparatus 400 includes a coated top surface 411 for reflecting energy onto the backside of wafer 461. Additionally, rapid thermal heating apparatus 400 includes a plurality of fiber optic probes 470 positioned through the bottom wall 415 of apparatus 400 in order to detect the temperature of substrate 461 at a plurality of locations across its bottom surface.

Rapid thermal heating apparatus 400 includes a gas inlet 469 formed through sidewall 414 for injecting process gas into chamber 413 to allow various processing steps to be carried out in chamber 413. Coupled to gas inlet 469 are one or more gas sources (not shown). Positioned on the opposite side from gas inlet 469, in sidewall 414, is a gas outlet 468. Gas outlet 468 is coupled to a vacuum source (not shown), such as a pump, to exhaust process gas from chamber 413 and to reduce the pressure in chamber 413. The vacuum source maintains a desired pressure while process gas is fed into the chamber during processing.

Figure 5:
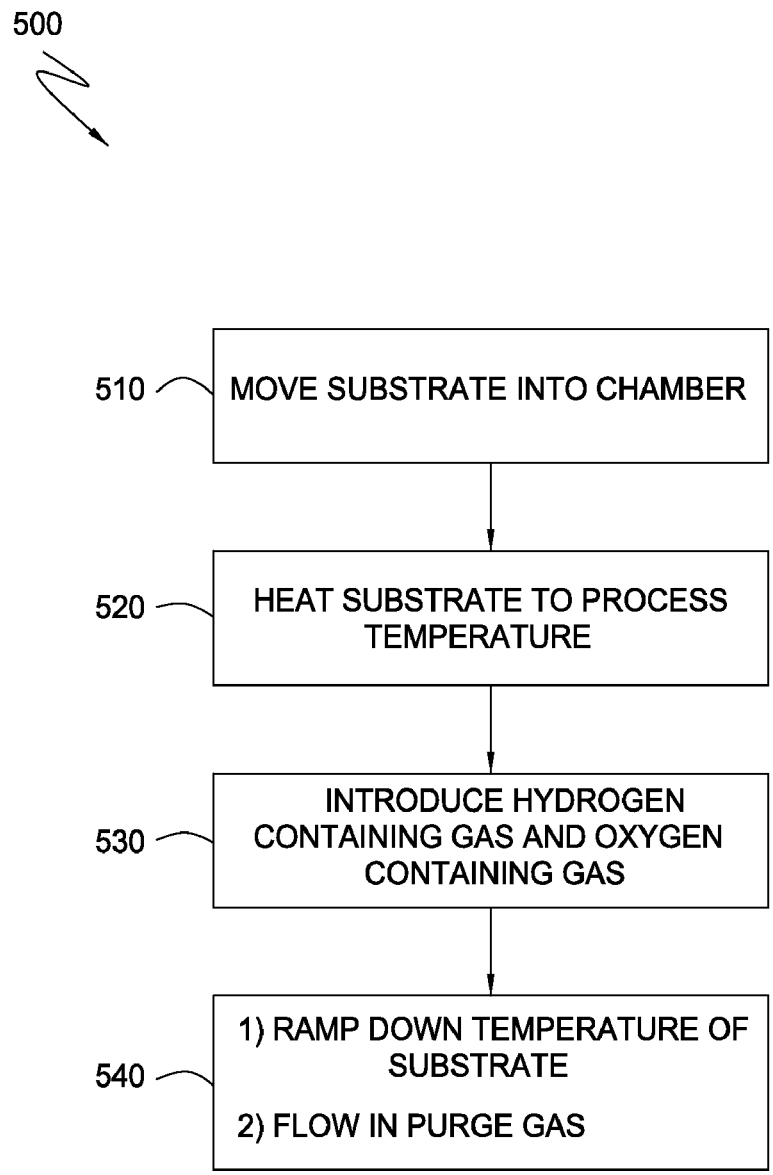
FIG. 5 is a flow chart of one embodiment of an in-situ steam generation process.

FIG. 5 is a flow chart of one embodiment of an ISSG process 500. The ISSG process may be performed in any suitable chamber. For clarity of description, the ISSG process 500 will be described in reference to substrate processing apparatus 400 as described in FIG. 4 and will be described in reference to a 200 mm diameter substrate. The process conditions may vary depending on the apparatus used and the size of the substrate.

In step 510 of the process 500, the substrate 461 is moved into the chamber 413. The substrate 461 is generally transferred into the chamber 413 having a non-reactive gas ambient, such as a nitrogen ($N_2$) ambient, at a transfer pressure between about 1 mtorr and about 100 torr, preferably between about 1 torr and about 10 torr. Chamber 413 is then sealed. The chamber 413 may be evacuated to a pressure to remove the nitrogen ambient.

In step 520, the substrate 461 is heated or is ramped to a process temperature by applying power to lamps 419. The process temperature may be any suitable temperature, such as between about 400° C. and about 1250° C., preferably between about 700° C. and about 900° C., more preferably between about 775° C. and about 825° C. During at least a portion of step 520, a non-reactive gas, such as helium gas or nitrogen gas, may be introduced into the chamber. It is believed that the non-reactive gas acts as a thermal conductor and helps to improve temperature uniformity. Preferably, the non-reactive gas which is used is helium gas introduced at a flow rate between about 0.1 slm and about 10 slm, preferably about 1 slm. Not wishing to be bound by theory unless explicitly set forth in the claims, it is believed that helium is a better thermal conductor than $N_2$. In addition or alternatively, one or more process gases may be introduced during the ramp. Preferably, a hydrogen containing gas is introduced, such as hydrogen ($H_2$) gas, at a flow rate between about 1 sccm and 20 sccm, preferably about 5 sccm.

In step 530, at the desired process temperature, a hydrogen containing gas and an oxygen containing gas are introduced to the chamber 413. The hydrogen containing gas and the oxygen containing gas are introduced to be reacted together to form water vapor ($H_2O$) at the desired process temperature. The hydrogen containing gas is preferably hydrogen gas ($H_2$), but may be other hydrogen containing gases such as, but not limited to, ammonia ($NH_3$), deuterium, and hydrocarbons, such as methane ($CH_4$). The oxygen containing gas is preferably nitrous oxide ($N_2O$), but may be other types of oxygen containing gases such as but not limited to oxygen gas ($O_2$). It is believed that $N_2O$ provides a more controlled hydroxylation of the substrate surface in comparison to the use of $O_2$ which is more reactive than $N_2O$. A non-reactive gas, such as helium gas, nitrogen gas, or other non-reactive gases, may be introduced during step 530. It is believed that the non-reactive gas acts as a thermal conductor to help improve temperature uniformity. In addition or alternatively, it is believed that a non-reactive acts to catalyze the in-situ steam generation process by isolating reaction fragments. A helium non-reactive gas is preferred over a nitrogen non-reactive gas because it is believed that the helium non-reactive gas is a better thermal conductor and better at catalyzing the ISSG process.

The hydrogen containing gas and the oxygen containing gas may be introduced at any suitable chamber pressure, such as between about 0.1 Torr and about 200 Torr, preferably between about 1 Torr and about 20 Torr. Any concentration ratio of hydrogen containing gas and oxygen containing gas may be used. Preferably, a high ratio of oxygen containing gas to hydrogen containing gas is used. For example, a process gas mixture comprising a ratio of oxygen containing gas to hydrogen containing gas is preferably between about 65:35 and about 99.9:0.1, preferably about 99.5:0.5.

The desired process temperature causes the hydrogen containing gas and oxygen containing gas to react to form moisture or steam ($H_2O$). Since rapid thermal heating apparatus 400 is a "cold wall" reactor, the only sufficiently hot surfaces in chamber 413 to initiate the reaction are the substrate 461 and support ring 462. As such, the moisture generating reaction occurs near the surface of substrate 461. Since it is the temperature of the substrate (and support ring) which initiates or turns "on" the moisture generation reaction, the reaction is said to be thermally controlled by the temperature of wafer 461 (and support ring 462). Additionally, the vapor generation reaction is said to be "surface catalyzed" because the heated surface of the substrate is necessary for the reaction to occur.

The hydrogen containing gas and the oxygen containing gas are introduced at a process temperature for a sufficient period of time to enable the water vapor generated from the reaction of the hydrogen containing gas and the oxygen containing gas to hydroxylate the substrate surface. The substrate 461 will typically be held at process temperature for a time period between about 1 minute and about 1 second or less, preferably for a time period of about 10 seconds or less. Process time and temperature are generally dictated by amount of hydroxylation desired and the type and concentrations of the process gases.

In step 540, power to lamps 419 is reduced or turned off to reduce or ramp down the temperature of substrate 461. Simultaneously, a purge gas, such as nitrogen gas ($N_2$), is fed into the chamber 413 to remove residual process gases. Then, the substrate 461 may be removed from the chamber 413.

Although the present invention has been described with respect to in-situ generation of a vapor of a specific reactive species, water, it is to be appreciated that the teachings of the present invention can be applied to other processes where the temperature of a substrate is used to initiate or catalyze the reaction of reactant gases to form a vapor of a reactive species near the wafer surface. The reactive species vapor can then be reacted with the wafer or with films formed thereon to carry out processes such as film growth. For example, a reactant gas mixture comprising ammonia ($NH_3$) and oxygen ($O_2$) can be fed into a chamber and then caused to react by heating a wafer to a sufficient temperature to initiate a reaction of the gases to form an oxy-nitride surface.

High K Dielectric Layer Formation

Referring to step 130 of FIG. 1, a high k dielectric layer may be formed by chemical vapor deposition (including metal-organic chemical vapor deposition (MOCVD), low pressure chemical vapor deposition, plasma-enhanced chemical vapor deposition), atomic layer deposition (ALD), physical vapor deposition, vapor phase epitaxy (VPE), other suitable deposition techniques, and combination of deposition techniques.

One embodiment of a chamber capable of depositing a high k dielectric layer by MOCVD is disclosed in commonly assigned U.S. patent application Ser. No. 09/179,921, which is incorporated by reference in its entirety to the extent not inconsistent with the present disclosure.

Figure 6:
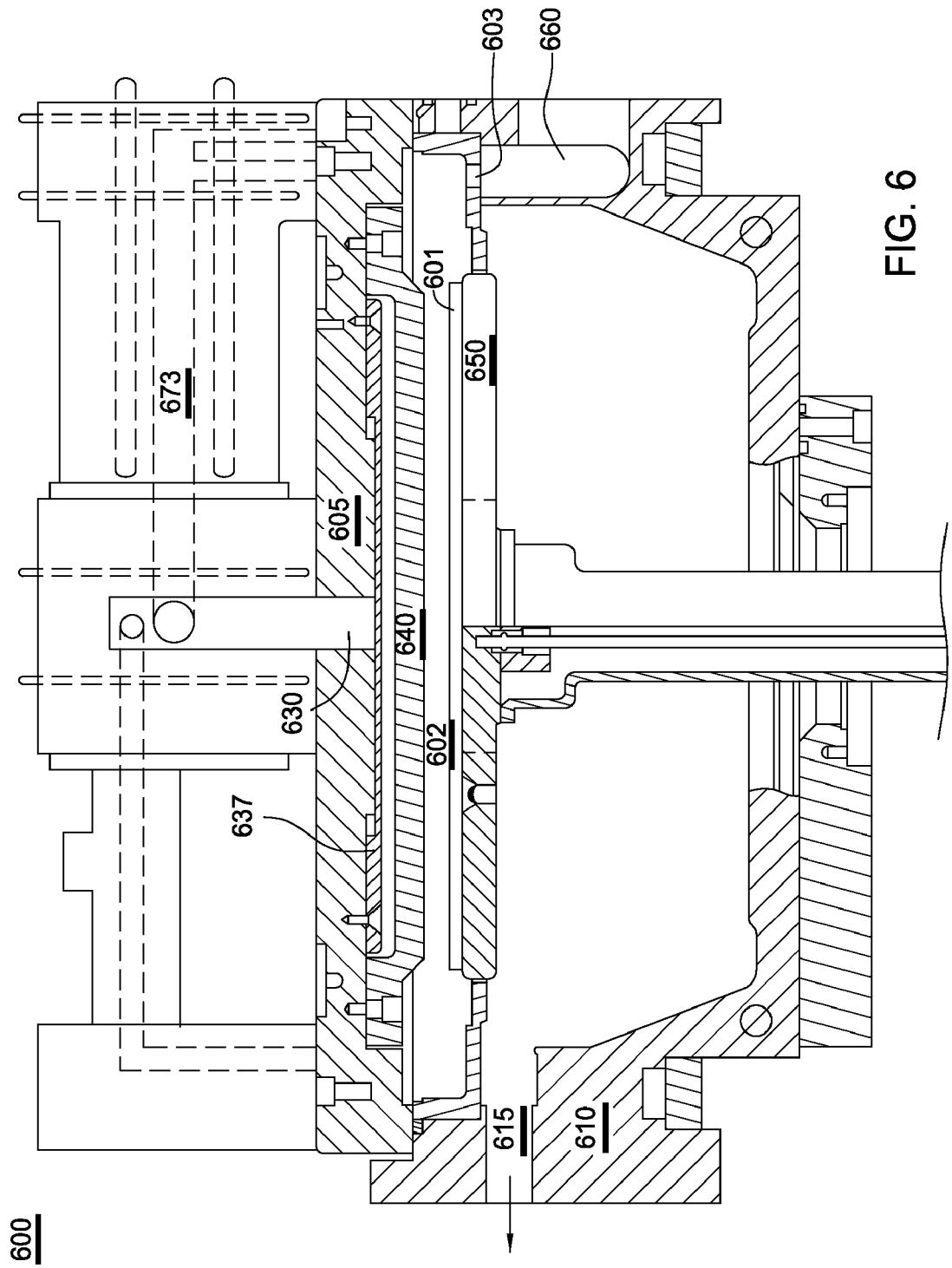
FIG. 6 is a schematic cross-sectional view of one embodiment of a chamber capable of depositing a high k dielectric layer by chemical vapor deposition.

FIG. 6 is a schematic cross sectional view of one embodiment of a chamber 600 capable of depositing a high k dielectric layer, such as hafnium containing layer, by MOCVD. Chamber body 610 and heated chamber lid 605, which is hingedly connected to chamber body 610, together form a processing region 602 bounded by showerhead 640, substrate support 650, and the walls of chamber body 610. Substrate support 650 (shown in the raised position for processing) extends through the bottom of chamber body 610. A slit valve 615 allows substrates to be transferred to and from the processing region 602.

Imbedded within substrate support 650 is a resistive heater. A thermocouple in thermal contact with substrate support 650 may sense the temperature of substrate support 650 to allow for temperature control of heated substrate support 650. Substrate 601 is supported by the upper surface of support 650 and is heated by the resistive heaters within substrate support 650 to processing temperatures.

Turning now to gas delivery features of chamber 600, process gases are introduced via conduit 673, through central bore 630 and flow through blocker plate 637 and showerhead 640 into processing region 602. Pumping passage 603 and outlet port 660 formed within chamber body 610 remove process gas and by-products of processing operations conducted within processing region 602.

Figure 7:
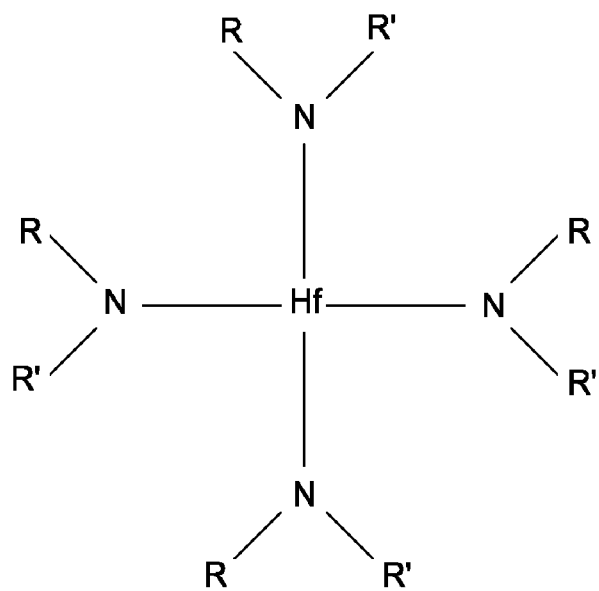
FIG. 7 is a general chemical structure for one embodiment of a hafnium metal organic precursor.

For illustration purposes, deposition of a high k dielectric layer will be described in reference to MOCVD of a hafnium oxide layer. Metal-organic CVD of hafnium oxide comprises introducing a hafnium organic precursor and introducing an oxygen containing compound to the chamber, such as chamber 600 of FIG. 6. Examples of a hafnium organic precursor include the compound having the structure of $Hf(NRR')_4$ shown in FIG. 7, wherein at least one of R and R' are as follows:

R=H, $CH_3$, $C_2H_5$, $C_3H_7$, CO, NCO, alkyl, or aryl and

R'=H, $CH_3$, $C_2H_5$, $C_3H_7$, CO, NCO, alkyl, or aryl.

R and R' may or may not be the same. Preferably, both R and R' are an alkyl group having one to four carbon atoms, and more preferably are the same alkyl group. Examples of preferred hafnium organic precursors include tetrakis(diethylamido)hafnium (TDEAH) and tetrakis (dimethylamido) hafnium, and most preferably is TDEAH. Examples of an oxygen containing compound include oxygen gas ($O_2$). Other oxygen containing compounds may also be used, such as ozone, $H_2O$, $N_2O$, and atomic oxygen (i.e. oxygen plasma).

One embodiment of a process for depositing hafnium oxide by MOCVD will be described in reference to a 200 mm diameter substrate. The process conditions may vary depending on the apparatus used and the size of the substrate. One embodiment of depositing hafnium oxide comprises flowing TDEAH onto the substrate surface at a rate between about 1 mg/min and about 50 mg/min, preferably about 7 mg/min, $O_2$ is flowed onto the wafer surface between about 30 sccm and about 3,000 sccm, preferably 1,000 sccm, and $N_2$ is flowed onto the wafer surface at a rate between about 30 sccm and about 3,000 sccm, preferably about 1,500 sccm. $O_2$, $N_2$ and TDEAH are introduced onto the wafer surface either simultaneously, sequentially, or a combination thereof.

The hafnium oxide layer is formed at temperatures in the range between about 225° C. and about 700° C. Preferably, the hafnium oxide layer is formed at about 485° C. The pressure in the deposition chamber is in the range between about 1.5 Torr and about 8 Torr, preferably about 4 Torr. The process may be performed for a specified time period, preferably about 60 seconds or less. Preferably, the hafnium oxide layer formed has a thickness between about 20 Å and about 50 Å, preferably about 40 Å or less.

Processing System

The processes in the formation of a high k dielectric layer as disclosed herein may be carried out in one or more single chamber systems, one or more mainframe systems having a plurality of chambers, or combinations thereof. The processes may be performed in separate processing systems or an integrated processing system.

Figure 8:
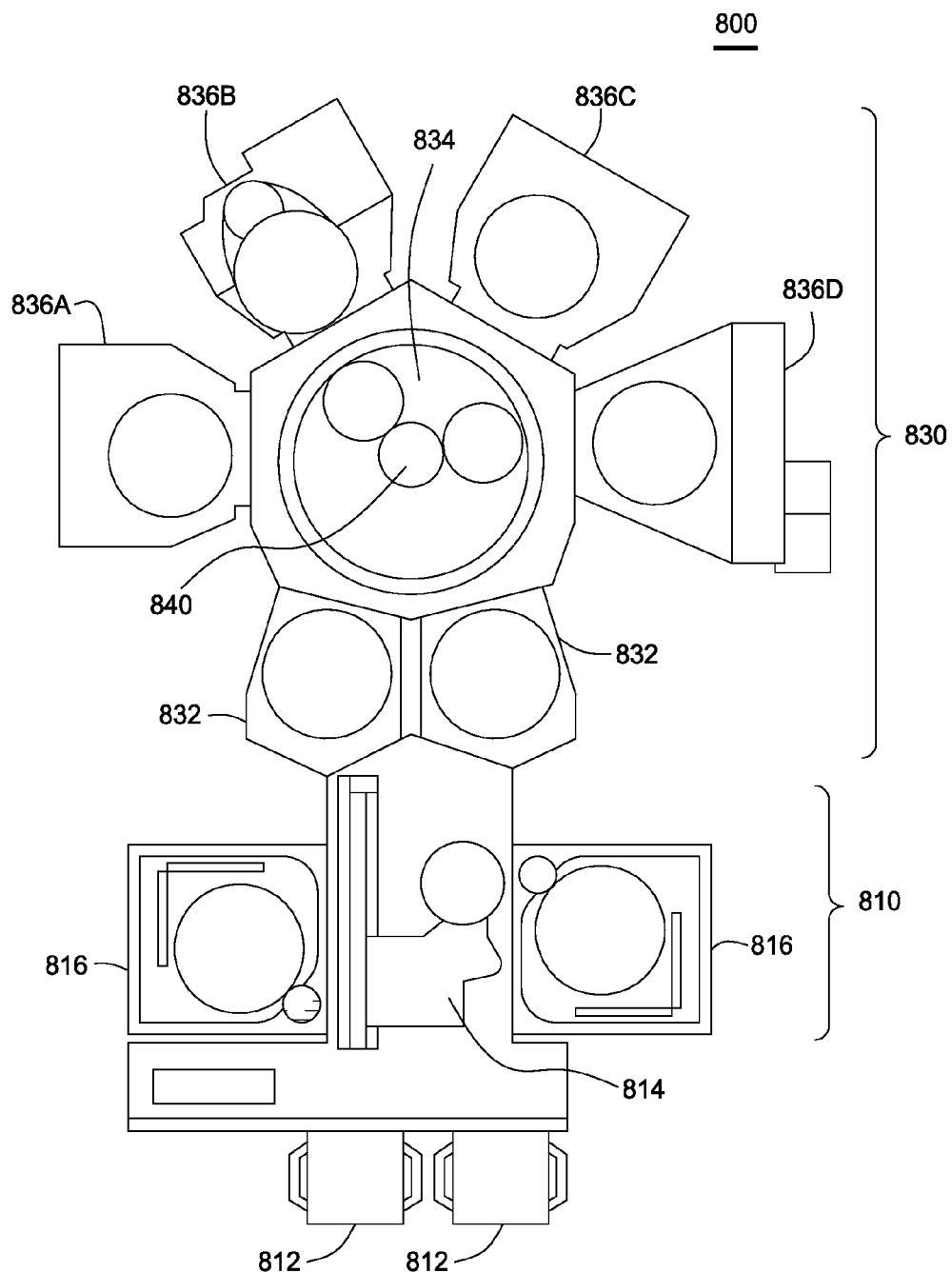
FIG. 8 is a schematic top view of one embodiment of an integrated processing system.

FIG. 8 is a schematic top view of one embodiment of an integrated system 800 capable of performing the processes disclosed herein. The integrated system 800 comprises a cleaning module 810 and a thermal processing/deposition mainframe system 830. As shown in the figure, the cleaning module 810 is an OASIS CLEAN™ system, available from Applied Materials, Inc., located in Santa Clara, Calif. The thermal processing/deposition mainframe system 830 is a CENTURA® system and is also commercially available from Applied Materials, Inc., located in Santa Clara, Calif. The particular embodiment of the system to perform the process as disclosed herein is provided to illustrate the invention and should not be used to limit the scope of the invention unless otherwise set forth in the claims.

The cleaning module 810 generally includes one or more substrate cassettes 812, one or more transfer robots 814 disposed in a substrate transfer region, and one or more single-substrate clean chambers 816. The single-substrate clean chambers 816 may be similar to chamber described in reference to FIG. 3.

The thermal processing/deposition mainframe system 830 generally includes load lock chambers 832, a transfer chamber 834, and processing chambers 836A, 836B, 836C, 836D. The load lock chambers 832 allow for the transfer of substrates into and out from the thermal processing/deposition mainframe system 830 while the transfer chamber 834 remains under a low pressure non-reactive environment. The transfer chamber includes a robot 840 having one or more blades which transfers the substrates between the load lock chambers 832 and processing chambers 836A, 836B, 836C, 836D. Any of the processing chambers 836A, 836B, 836C, 836D may be removed from the thermal processing/deposition mainframe system 830 if not necessary for the particular process to be performed by the system 830. The transfer region is preferably between 1 mtorr to about 100 torr and preferably comprises a non-reactive gas ambient, such as an $N_2$ ambient.

It is believed that it is advantageous to perform the pre-treatment step 120 (FIG. 1) and the high k dielectric layer formation 130 (FIG. 1) on a mainframe system to reduce the formation of native oxides and/or contamination of the pre-treated surface of a substrate prior to formation of the high k dielectric layer. Exposing the substrate to air between the pre-treatment step 120 and the high k dielectric layer formation 130 may reduce the effectiveness of nucleation thereover of high k dielectric materials. It is optional to have the cleaning module 810 coupled with mainframe system 830 as shown in FIG. 8 to further reduce the formation of native oxides over and/or contamination of substrates between cleaning steps and other processing steps. Of course, in other embodiments, cleaning steps may be performed in a cleaning module separate from the thermal processing/deposition mainframe system.

One embodiment of the integrated system 800 configured to form a high k dielectric layer comprises processing chamber 836B adapted to perform an ISSG process as described above and a processing chamber 836C, such as a chemical vapor deposition chamber or an atomic layer deposition chamber, adapted to deposit a high dielectric constant material, such as a hafnium containing layer. Other embodiments of the system 800 are within the scope of the present invention. For example, the position of a particular processing chamber on the system may be altered.

EXAMPLES

Various samples of silicon substrates were processed. Each silicon substrate comprised 200 mm diameter wafers.

Comparative Example 1

Sample 1 was pre-cleaned using a hydrofluoric acid solution to form an HF-last surface. A layer of hafnium oxide was deposited by MOCVD to a thickness of about 40 Å over the substrate surface at a temperature of about 325° C. The roughness of the hafnium oxide surface of Sample 1 was measured to have an Rms (nm) of 0.580, an Ra (nm) of 0.45 and an Rmax (nm) of 10.01.

Example 2

Samples 2-5 were pre-cleaned using a hydrofluoric acid solution to form an HF-last surface. Thereafter, Samples 2-5 were pre-treated with a rapid thermal oxidation (RTO) process in an $O_2$ ambient. Sample 2 was pre-treated with an RTO process at a temperature of about 900° C. for a time period of about 10 seconds. Sample 3 was pre-treated with an RTO process at a temperature of about 900° C. for a time period of about 5 seconds. Sample 4 was pre-treated with an RTO process at a temperature of about 850° C. for a time period of about 10 seconds. Sample 5 was pre-treated with an RTO process at a temperature of about 850° C. for a time period of about 5 seconds. A layer of hafnium oxide was deposited by MOCVD over the substrate surface to a thickness of about 40 Å at a temperature of about 325° C. over each of the Samples 2-5. The roughnesses of the hafnium oxide surfaces of Samples 2-5 were measured and are shown below in Table 1. Samples 2-5 had lower surface roughness in comparison to Sample 1.

TABLE 1

|  | Rms (nm) | Ra (nm) | Rmax (nm) |
| --- | --- | --- | --- |
| Sample 2 | 0.386 | 0.306 | 3.724 |
| Sample 3 | 0.387 | 0.307 | 3.812 |
| Sample 4 | 0.394 | 0.313 | 3.678 |
| Sample 5 | 0.393 | 0.311 | 3.882 |

Example 3

Sample 6 was pre-cleaned using a hydrofluoric acid solution to form an HF-last surface. Thereafter, Sample 6 was pre-treated with an oxygen ($O_2$) soak. A layer of hafnium oxide was deposited by MOCVD to a thickness of about 40 Å over the substrate surface at a temperature of about 325° C. The roughness of the hafnium oxide surface of Sample 6 was measured to have an Rms (nm) of 0.714, an Ra (nm) of 0.567, and an Rmax (nm) of 6.618. Sample 6 had a higher surface roughness in comparison to Sample 1.

Example 4

Samples 7-9 were pre-treated with a high dose decoupled plasma nitridation. Thereafter, for Sample 7, a layer of hafnium oxide was deposited by MOCVD to a thickness of about 40 Å over the substrate surface at a temperature of about 325° C. Sample 8 was cleaned using a hydrofluoric acid solution to form an HF-last surface and a layer of hafnium oxide was deposited by MOCVD to a thickness of about 40 Å over the substrate surface at a temperature of about 325° C. Sample 9 was cleaned using a hydrofluoric acid solution to form an HF-last surface and treated with a rapid thermal oxidation process at a temperature about 900° C. The roughnesses of the surfaces of the Samples 7-9 were measured and are shown in Table 2. Note that a layer of hafnium oxide was not deposited over Sample 9. Sample 7 had a slightly higher surface roughness in comparison to Sample 1 while Sample 8 had a slightly lower surface roughness in comparison to Sample 1.

TABLE 2

|  | Rms (nm) | Ra (nm) | Rmax (nm) |
| --- | --- | --- | --- |
| Sample 7 | 0.611 | 0.483 | 5.439 |
| Sample 8 | 0.539 | 0.425 | 4.899 |
| Sample 9 | 0.265 | 0.209 | 2.680 |

Example 5

Samples 10-12 were pre-treated with a low dose decoupled plasma nitridation process. Thereafter, for Sample 10, a layer of hafnium oxide was deposited by MOCVD to a thickness of about 40 Å over the substrate surface at a temperature of about 325° C. Sample 11 was cleaned using a hydrofluoric acid solution and a layer of hafnium oxide was deposited by MOCVD to a thickness of about 40 Å at a temperature of about 325° C. Sample 12 was pre-cleaned using a hydrofluoric acid solution to form an HF-last surface and treated with a rapid thermal oxidation process at a temperature of about 900° C. Then, for Sample 12, a layer of hafnium oxide was deposited by MOCVD to a thickness of about 40 Å over the substrate surface at a temperature of about 325° C. The roughnesses of the hafnium oxide surface of Samples 10-12 were measured and are shown below in Table 3. Sample 10 had a slightly higher surface roughness in comparison to Sample 1 while Sample 11 had a slightly lower surface roughness in comparison to Sample 1 and while Sample 12 had a lower surface roughness in comparison to Sample 1.

TABLE 3

|  | Rms (nm) | Ra (nm) | Rmax (nm) |
| --- | --- | --- | --- |
| Sample 10 | 0.593 | 0.470 | 5.521 |
| Sample 11 | 0.573 | 4.455 | 4.971 |
| Sample 12 | 0.266 | 0.210 | 2.773 |

Example 6

Samples 13-15 were pre-cleaned using a hydrofluoric acid solution to form an HF-last surface. Thereafter, Samples 13-15 were pre-treated with an ISSG process utilizing $H_2$ gas and $N_2O$ gas. Sample 13 was pre-treated in the ISSG process for a time period of about 4 seconds. Sample 14 was pre-treated in the ISSG process for a time period of about 6 seconds. Sample 15 was pre-treated in the ISSG process for a time period of about 8 seconds. A layer of hafnium oxide was deposited by MOCVD over the substrate surface to a thickness of about 40 Å at a temperature of about 325° C. over each of the Samples 13-15. The roughnesses of the hafnium oxide surface of Samples 13-15 were measured and are shown below in Table 4. Samples 13-15 had much lower surface roughnesses in comparison to Sample 1.

TABLE 4

|  | Rms (nm) | Ra (nm) | Rmax (nm) |
| --- | --- | --- | --- |
| Sample 13 | 0.255 | 0.201 | 2.688 |
| Sample 14 | 0.262 | 0.206 | 2.654 |
| Sample 15 | 0.260 | 0.204 | 2.498 |

While the foregoing is directed to embodiments of the present invention, other and further embodiments of the invention may be devised without departing from the basic scope thereof, and the scope thereof is determined by the claims that follow.

The invention claimed is:

1. A method for forming a layer on a substrate, comprising:
cleaning a surface of the substrate to remove native oxides;
heating the substrate surface, after the cleaning, to a temperature between about 700° C. and about 900° C.;
reacting a hydrogen containing gas and an oxygen containing gas near the surface of the substrate in a chamber to form a hydroxylating gas;
exposing the substrate to the hydroxylating gas in the chamber to form a hydroxylated surface on the substrate;
forming a first layer on at least a portion of the hydroxylated surface using a first atomic layer deposition process, wherein the first layer comprises hafnium oxide; and
forming a second layer on at least a portion of the first layer, using a second atomic layer deposition process, wherein the second layer comprises hafnium silicate.

2. The method of claim 1, wherein the native oxides are removed by exposing the surface of the substrate to hydrofluoric acid solution during the cleaning.

3. The method of claim 1, further comprising:
exposing the substrate to a non-reactive gas while forming the hydroxylating surface thereon.

4. The method of claim 1, wherein a ratio of the oxygen containing gas to the hydrogen containing gas is between about 65:35 to about 99.9:0.1.

5. The method of claim 1, wherein the hafnium oxide layer and the hafnium silicate layer have a different concentration of hafnium.

6. A method of forming a high dielectric constant layer over a substrate, comprising:
pre-cleaning a surface of the substrate to remove native oxides;
heating the substrate surface, after the pre-cleaning, to a temperature between about 700° C. and about 900° C.;
reacting a hydrogen containing gas and another gas selected from the group consisting of an oxygen containing gas or nitrous oxide in a chamber near the surface of the substrate to form a hydroxylating gas;
exposing the substrate to the hydroxylating gas in the chamber to form a hydroxylated surface thereon; and
forming a dielectric material on the hydroxylated surface of the substrate by forming a plurality of hafnium silicate layers using atomic layer deposition, wherein each hafnium silicate layer comprises different proportions of hafnium, silicon, and oxygen atoms.

7. The method of claim 6, wherein the native oxides are removed by exposing the surface of the substrate to a hydrofluoric acid solution during the pre-cleaning.

8. The method of claim 6, further comprising:
exposing the substrate to a non-reactive gas while forming the hydroxylating surface thereon.

9. The method of claim 6, wherein an upper hafnium silicate layer has more silicon than a lower hafnium silicate layer.

10. The method of claim 6, wherein each hafnium silicate layer has a different concentration of hafnium.

11. The method of claim 6, wherein each hafnium silicate layer has a different concentration of silicon.

12. A method for forming a high dielectric constant layer on a substrate, comprising:
pre-cleaning a surface of the substrate to remove native oxides;
heating the substrate surface, after the pre-cleaning, to a temperature between about 700° C. and about 900° C.;
reacting a hydrogen containing gas and an oxygen containing gas in a chamber near the surface of the substrate to form a hydroxylating gas;
exposing the substrate to the hydroxylating gas in the chamber to form a hydroxylated surface thereon; and
forming the high dielectric constant material on the hydroxylated surface of the substrate by forming a plurality of hafnium containing layers using a method selected from the group consisting of atomic layer deposition and chemical vapor deposition.

13. The method of claim 12, wherein an upper hafnium containing layer has more silicon than a lower layer.

14. The method of claim 12, wherein each hafnium containing layer has a different concentration of hafnium.

15. The method of claim 12, wherein each hafnium containing layer has a different composition.

16. The method of claim 12, wherein a ratio of the oxygen containing gas to the hydrogen containing gas is between about 65:35 to about 99.9:0.1.

17. The method of claim 12, wherein the plurality of hafnium containing layers comprise hafnium silicate layers.

18. The method of claim 17, wherein each hafnium silicate layer has a different concentration of hafnium.

19. The method of claim 17, wherein each hafnium silicate layer has a different concentration of silicon.

20. The method of claim 12, wherein the oxygen containing gas comprises molecular oxygen or nitrous oxide.

* * * * *